United States Patent
Cao et al.

(10) Patent No.: US 8,942,463 B2
(45) Date of Patent: Jan. 27, 2015

(54) HARMONIC RESIST MODEL FOR USE IN A LITHOGRAPHIC APPARATUS AND A DEVICE MANUFACTURING METHOD

(71) Applicant: ASML Netherlands B.V., Veldhoven (NL)

(72) Inventors: Yu Cao, Saratoga, CA (US); Luoqi Chen, Saratoga, CA (US); Antoine Jean Bruguier, Milpitas, CA (US); Wenjin Shao, Sunnyvale, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/224,534

(22) Filed: Mar. 25, 2014

(65) Prior Publication Data

US 2014/0198972 A1 Jul. 17, 2014

Related U.S. Application Data

(60) Continuation of application No. 13/896,805, filed on May 17, 2013, now Pat. No. 8,682,059, which is a division of application No. 12/625,079, filed on Nov. 24, 2009, now Pat. No. 8,447,095.

(60) Provisional application No. 61/117,396, filed on Nov. 24, 2008.

(51) Int. Cl.
*G06K 9/62* (2006.01)
*G06T 3/00* (2006.01)
*G03F 7/20* (2006.01)
*G06T 7/00* (2006.01)

(52) U.S. Cl.
CPC .............. *G06T 3/0056* (2013.01); *G03F 7/705* (2013.01); *G03F 7/70666* (2013.01); *G03F 7/70675* (2013.01); *G06T 7/0004* (2013.01)
USPC ............................ 382/144; 382/141; 382/145

(58) Field of Classification Search
USPC ......... 382/144, 141, 145, 149; 716/21; 703/2, 703/5, 13; 430/5, 30
See application file for complete search history.

(56) References Cited

U.S. PATENT DOCUMENTS

| | | | |
|---|---|---|---|
| 6,223,139 B1 | 4/2001 | Wong et al. | |
| 6,738,859 B2 | 5/2004 | Liebchen | |
| 6,765,651 B1 | 7/2004 | Fiekowsky et al. | |
| 6,871,337 B2 | 3/2005 | Socha | |
| 7,010,776 B2 * | 3/2006 | Gallatin et al. | 716/53 |

(Continued)

FOREIGN PATENT DOCUMENTS

| | | |
|---|---|---|
| EP | 1 628 157 | 2/2006 |
| JP | 07-334690 | 12/1995 |

(Continued)

OTHER PUBLICATIONS

Japanese Office Action mailed Nov. 4, 2011 in corresponding Japanese Patent Application No. 2009-261410.

*Primary Examiner* — Sang Nguyen
(74) *Attorney, Agent, or Firm* — Pillsbury Winthrop Shaw Pittman LLP

(57) ABSTRACT

A method for determining an image of a mask pattern in a resist coated on a substrate, the method including determining an aerial image of the mask pattern at substrate level; and convolving the aerial image with at least two orthogonal convolution kernels to determine a resist image that is representative of the mask pattern in the resist.

26 Claims, 5 Drawing Sheets

(56) References Cited

U.S. PATENT DOCUMENTS

| | | |
|---|---|---|
| 7,055,126 B2 | 5/2006 | Gallatin et al. |
| 7,079,223 B2 | 7/2006 | Rosenbluth et al. |
| 7,088,419 B2 | 8/2006 | Dowski et al. |
| 7,094,507 B2 | 8/2006 | Hirscher et al. |
| 7,242,459 B2 | 7/2007 | Shi et al. |
| 7,331,033 B2 | 2/2008 | Feldman |
| 7,378,202 B2 | 5/2008 | Granik et al. |
| 7,434,199 B2 | 10/2008 | Cobb et al. |
| 7,494,753 B2 | 2/2009 | Chen et al. |
| 7,500,218 B2 | 3/2009 | Troost et al. |
| 7,703,069 B1 | 4/2010 | Liu et al. |
| 7,921,383 B1 | 4/2011 | Wei |
| 7,954,072 B2 | 5/2011 | Liu et al. |
| 8,120,753 B2 | 2/2012 | Berger et al. |
| 8,165,845 B1 | 4/2012 | Seebeck et al. |
| 8,379,991 B2 | 2/2013 | Cao et al. |
| 8,447,095 B2 | 5/2013 | Cao et al. |
| 2003/0103189 A1 | 6/2003 | Neureuther et al. |
| 2005/0076321 A1 | 4/2005 | Smith |
| 2005/0091634 A1 | 4/2005 | Gallatin et al. |
| 2005/0179886 A1 | 8/2005 | Shi et al. |
| 2005/0185159 A1* | 8/2005 | Rosenbluth et al. ............ 355/53 |
| 2005/0273753 A1* | 12/2005 | Sezginer .................... 716/21 |
| 2006/0040187 A1 | 2/2006 | Troost et al. |
| 2006/0208205 A1 | 9/2006 | Chen et al. |
| 2008/0002174 A1 | 1/2008 | Tinnemans |
| 2010/0128969 A1 | 5/2010 | Cao et al. |
| 2010/0260427 A1 | 10/2010 | Cao et al. |

FOREIGN PATENT DOCUMENTS

| | | |
|---|---|---|
| JP | 2000-221659 | 8/2000 |
| JP | 2000-243694 | 9/2000 |
| JP | 2002-184688 | 6/2002 |
| JP | 2005-128553 | 5/2005 |
| JP | 2005-128557 | 5/2005 |
| JP | 2005-217430 | 8/2005 |
| JP | 2005-228302 | 8/2005 |
| JP | 2005-234571 | 9/2005 |
| JP | 2006-058882 | 3/2006 |
| JP | 2006-210936 | 8/2006 |
| JP | 2008-020963 | 1/2008 |
| JP | 2008-040470 | 2/2008 |
| JP | 2008-047875 | 2/2008 |
| JP | 2008-506199 | 2/2008 |
| JP | 2008-102555 | 5/2008 |
| JP | 2009-031320 | 2/2009 |
| JP | 2010-118655 | 5/2010 |
| JP | 5398484 | 1/2014 |

* cited by examiner

US 8,942,463 B2

HARMONIC RESIST MODEL FOR USE IN A LITHOGRAPHIC APPARATUS AND A DEVICE MANUFACTURING METHOD

CROSS-REFERENCE TO RELATED APPLICATIONS

The present application is a Continuation of U.S. patent application Ser. No. 13/896,805, filed May 17, 2013 (now U.S. Pat. No. 8,682,059), which is a Divisional of U.S. patent application Ser. No. 12/625,079, filed Nov. 24, 2009, and issued as U.S. Pat. No. 8,447,095, which claims priority to U.S. Provisional Patent Application No. 61/117,396, filed Nov. 24, 2008, the contents of all of which are incorporated by reference in their entirety.

FIELD

The present invention generally relates to a method and computer product for performing simulations of the imaging results associated with a lithographic process.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to develop a practical lithographic resist process, it is desirable to first use a lithography simulation tool for process optimization. Subsequently, actual substrate printing verification may be performed. The challenge is how to ensure the prediction of a resist critical dimension (CD), a contour of the resist pattern and/or whether some contours of resist patterns are merged or cut with sufficient accuracy when using the simulation tool. Resist model calibration is one of the critical key factors in the simulation process, and the robustness of the simulation model is another important factor.

A typical lithography simulation involves three basic steps. First, an aerial image for the feature in question is calculated. The aerial image calculation is based on the optical settings of a lithographic apparatus, which include, for example, numerical aperture, exposure wavelength and characteristics of lenses. Second, a post exposure bake (PEB) step is performed. This step provides two functions: (1) allowing chemical amplification for photo speed to take place due to the heat, and (2) minimizing resist CD swing caused by standing wave effects. The third step involves developing a resist pattern based on the diffused aerial image.

In general, there are two conventional approaches to resist modeling: either through a slow but more physical modeling of the process or through a faster but empirical approach. However, none of these approaches to resist modeling provides satisfactory results. Indeed, these approaches may not fully represent the chemical processes and/or are generally time-consuming.

SUMMARY

It is desirable to provide a method that accurately and quickly simulates the image of a mask pattern in a photoresist.

In an aspect of the invention, there is provided a method for determining an image of a mask pattern in a resist coated on a substrate, the method including determining an aerial image of the mask pattern at substrate level; and convolving the aerial image with at least two orthogonal convolution kernels to determine a resist image that is representative of the mask pattern in the resist.

In another aspect of the invention, there is provided a method for determining an image of a mask pattern in a resist coated on a substrate, the method including determining an aerial image of the mask pattern at substrate level; and transforming the aerial image into a resist image that is representative of the image of the mask pattern in the resist, the aerial image being transformed into the resist image using a model that includes at least two convolution kernels, the transforming including convolving the aerial image with the at least two convolution kernels, wherein the at least two convolution kernels are selected such that the transformation of the aerial image into the resist image has the properties of rotational and mirror symmetry conservation.

In another aspect of the invention, there is provided a computer product having machine executable instructions, the instructions being executable by a machine to perform a method for determining an image of a mask pattern in a resist coated on a substrate, the method including determining an aerial image of the mask pattern at substrate level; and convolving the aerial image with at least two orthogonal convolution kernels to determine a resist image that is representative of the image of the mask pattern in the resist.

In another embodiment of the invention, there is provided a computer product having machine executable instructions, the instructions being executable by a machine to perform a method for determining an image of a mask pattern in a resist coated on a substrate, the method including determining an aerial image of the mask pattern at substrate level; and transforming the aerial image into a resist image that is representative of the image of the mask pattern in the resist, the aerial image being transformed into the resist image using a model that includes at least two convolution kernels, the transforming including convolving the aerial image with the at least two convolution kernels, wherein the at least two convolution kernels are selected such that the transformation of the aerial image into the resist image has the properties of rotational and mirror symmetry conservation.

These and other aspects, features, and characteristics of the present invention, as well as the methods of operation and functions of the related elements of structure will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
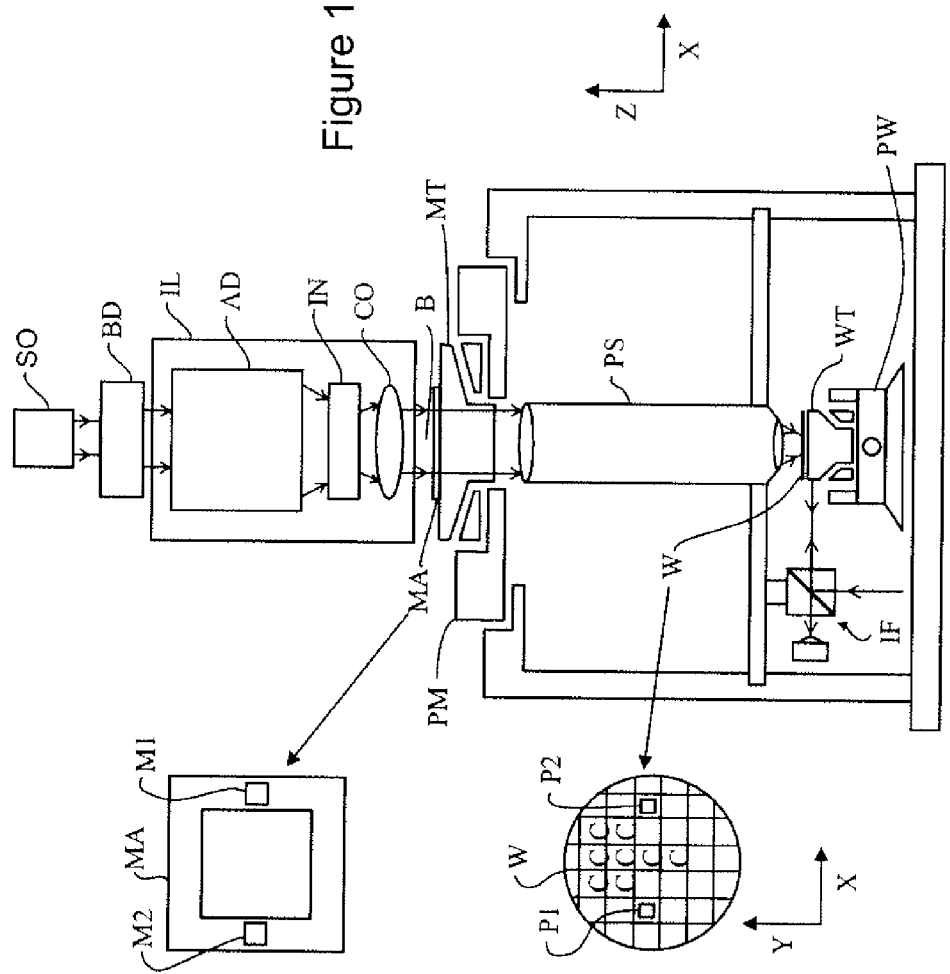
FIG. 1 shows a lithographic apparatus in accordance with an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not correspond exactly to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As depicted here, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning devices, such as a programmable mirror array of a type as referred to above.

Combinations and/or variations on the above described modes of use or entirely different modes of use may also be employed.

Conventional approaches that determine the resist image in a lithographic simulation involve convolving the aerial image (or a pixel-by-pixel transform of the aerial image) with various weighted kernels. These weighted kernels are usually Gaussian functions. These approaches are generally undesirable for several reasons. First, the chemical processes of conventional models are generally not computed accurately. With that said, the accuracy of the models cannot be increased without significantly increasing the computation time, which is undesirable. As a result, an empirical model is generally used. Second, the fitting of conventional empirical models is generally difficult. This results in potentially unstable fitting procedures, characterized by cancellations of model terms. Current models can have two Gaussian kernels with similar standard deviations. Two such kernels will be highly correlated and numerically unstable. Third, the kernels are selected arbitrarily and do not have any physical meaning. Fourth, current terms of simulation models have many non-linear parameters that need to be fitted. This requires many interactions between the user and the computer program. The user may have to run several fitting processes, changing the search range of the non-linear terms and verifying that the results are accurate and physically realistic. This approach is tedious and time-consuming for the user. This approach further requires more training and it is more an art than a science. The results of the model calibration may be highly dependent on who is doing it, which is undesirable in a production environment.

In one aspect of the invention, there is provided a model that accurately and quickly simulates the image of a mask pattern in a photoresist. The model, according to one embodiment of the invention, does not refer to any chemical processes. Rather, it is based mainly on mathematical and symmetry considerations of the underlying physics. The model involves convolving an aerial image with convolution kernels that form a complete orthogonal basis. It will be appreciated that a basis is complete when an infinite number of kernels are present. In one embodiment, some of the kernels may be used to calculate the resist image. The use of convolution orthogonal kernels to simulate a resist image provides significant benefits and unexpected results in terms of computation speed, accuracy and user's interaction over conventional simulation models.

Figure 2:
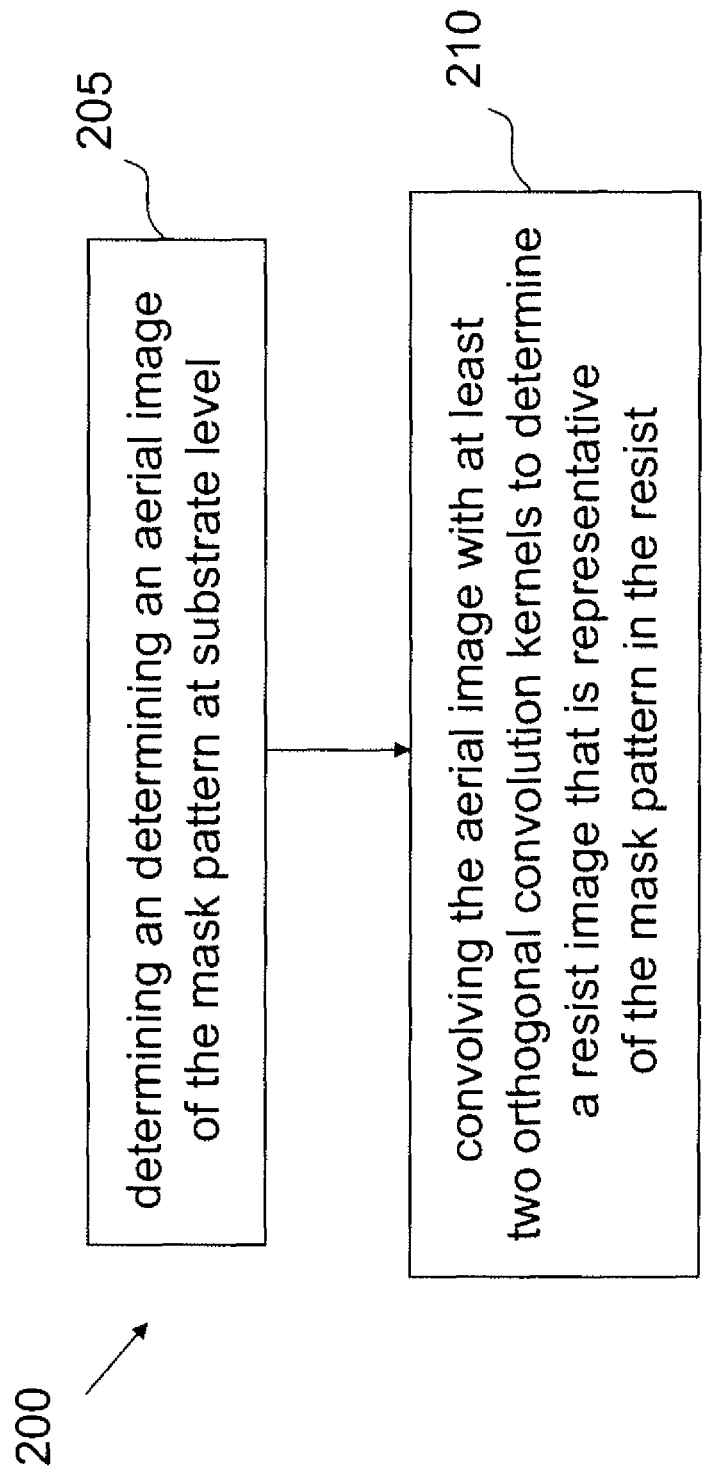
FIG. 2 is an exemplary flowchart illustrating a process of obtaining a resist image in accordance with an embodiment of the invention.

Referring now to FIG. 2, this figure shows an exemplary flowchart illustrating a process 200 of obtaining a resist image of a mask pattern in accordance with an embodiment of the invention. The process 200 begins at procedure 205 where an aerial image of a mask pattern is determined at substrate level.

The determined aerial image consists of a bitmap image of the pattern. The bitmap image is representative of the light intensity distribution of the image of the mask pattern projected by the lithographic apparatus. In practice, the aerial image of the mask pattern can be calculated using known lithography software simulation technologies/programs, such as Brion's Tachyon™, or Lithocruiser™, or KLA-Tencor's Prolith™. The contours of the mask pattern to be imaged, which may include optical proximity corrections (OPC), is provided in a standardized digital file format such as GDS, GDSII or OASIS and is inputted into these lithography software simulation programs to calculate the aerial image.

Determination of the aerial image of the mask pattern by these software products involves mathematically modeling the imaging of the pattern onto the substrate (e.g. from a mask), taking into account the illumination source, the projection optics and the pattern details. Efficient simulation methods that are fast enough for full-chip applications approximate the realistic 3-dimensional intensity distribution on the substrate by a 2-dimensional aerial image. An efficient implementation of a lithography model is possible using the following formalism, where the image (here in scalar form, which may be extended to include polarization vector effects) is expressed as a Fourier sum over signal amplitudes in the pupil plane. According to the standard Hopkins theory, the aerial image may be defined by:

$$A(x) = \sum_k S(k) \left| \sum_{k'} M(k'-k) P(k') \exp(-jk'x) \right|^2 \quad \text{(Eq. 1)}$$

$$= \sum_k S(k) \left\{ \sum_{k'} \sum_{k''} M(k'-k) P(k') M^*(k''-k) P^*(k'') \exp(-j(k'-k'')x) \right\}$$

$$= \sum_{k'} \sum_{k''} \left[ \sum_k S(k) P(k+k') P^*(k+k'') \right]$$

$$M(k') M^*(k'') \exp(-j(k'-k'')x)$$

$$= \sum_{k'} \sum_{k''} TCC_{k',k''} M(k') M^*(k'')$$

$$\exp(-j(k'-k'')x)$$

where, A (x) is the aerial image intensity at point x within the image plane (for notational simplicity, a two-dimensional coordinate represented by a single variable is utilized), k represents a point on the source plane, S (k) is the source intensity from point k, k' and k" are points on the pupil plane, M is the Fourier transform of the mask image, P is the pupil function, and $TCC_{k',k''}=\Sigma_k S(k) P(k+k') P^*(k+k'')$. An important aspect of the foregoing derivation is the change of summation order (moving the sum over k inside) and indices (replacing k' with k+k' and replacing k" with k+k"), which results in the separation of the Transmission Cross Coefficients (TCCs), defined by the term inside the square brackets in the third line of the equation. These coefficients are independent of the mask pattern and therefore can be pre-computed using knowledge of the optical elements or configuration only (e.g., NA and σ or the detailed illuminator profile). It is further noted that although in the given example (Eq. 1) is derived from a scalar imaging model, this formalism can also be extended to a vector imaging model, where the polarized light components are summed separately.

Furthermore, the approximate aerial image can be calculated by using only a limited number of dominant TCC terms, which can be determined by diagonalizing the TCC matrix and retaining the terms corresponding to its largest eigenvalues, i.e., $$TCC_{k',k''} = \sum_{i=1}^{N} \lambda_i \phi_i(k') \phi_i^*(k'') \quad \text{(Eq. 2)}$$

where $\lambda_i$ (i=1, . . . , N) denotes the N largest eigenvalues and $\phi_i(.)$ denotes the corresponding eigenvector of the TCC matrix. It is noted that (Eq. 2) is exact when all terms are retained in the Eigen series expansion, i.e., when N is equal to the rank of the TCC matrix. However, in actual applications, it is typical to truncate the series by selecting a smaller N to increase the speed of the computation process.

$$A(x) = \sum_{k'} \sum_{k''} TCC_{k',k''} M(k') M^*(k'') \exp(-j(k'-k'')x)$$

$$= \sum_{k'} \sum_{k''} \sum_{i=1}^{N} \lambda_i \phi_i(k') \phi_i^*(k'') M(k') M^*(k'') \exp(-j(k'-k'')x)$$

$$= \sum_{i=1}^{N} \lambda_i \sum_{k'} \phi_i(k') M(k') \exp(-jk'x)$$

$$\sum_{k''} \phi_i^*(k'') M^*(k'') \exp(jk''x)$$

-continued $$= \sum_{i=1}^{N} \lambda_i |\Phi_i(x)|^2$$

Thus, (Eq. 1) can be rewritten as:
(Eq. 3)
where $$\Phi_i(x) = \sum_{k''} \phi_i(k'') M(k'') \exp(-jk''x)$$

and |.| denotes the magnitude of a complex number.

Using a sufficiently large number of TCC terms and a suitable model calibration methodology allows for an accurate description of the optical projection process and provides an accurate representation of the aerial image. Additional information regarding the calculation of an aerial image can be gleaned from U.S. Pat. No. 6,871,337 issued on Mar. 22, 2005 titled "Illumination Optimization For Specific Mask Patterns", the contents of which is incorporated herein in its entirety by reference.

Referring back to FIG. 2, after determining the aerial image A of the mask pattern, the method proceeds to procedure 210 where the aerial image A is convolved with a number of orthogonal convolution kernels (e.g. in an embodiment at least two orthogonal convolution kernels) to determine a resist image R that is representative of the pattern in the resist. As discussed above, the aerial image A of the mask pattern is a bitmap image that represents the light intensity distribution of the image of the mask pattern projected by the lithographic apparatus. Convolution of each point of the bitmap image with a convolution kernel operates to smooth the energy of that point within the resist and provides a second bitmap image that is representative of the image of the mask pattern in the resist. In essence, the convolution of the aerial image of the mask pattern with a convolution kernel results in averaging the intensity of energy in the resist—averaging the energy at a point and energies nearby.

This resist image can then be used to perform optical proximity correction, contour computation, defect detection, or verification of manufacturability.

In an embodiment of the invention, the convolution kernels that are used to convolve the aerial image are orthogonal kernels that form an orthogonal basis. In one implementation, these orthogonal convolution kernels are solutions $\psi$ of a two dimensional quantum harmonic oscillator $\hat{H}\Psi=E\Psi$, with $$\hat{H} = -\frac{\hbar^2}{2m}\Delta_2 + \frac{1}{2}mw^2r^2 \cdot \left(\Delta_2 = \frac{1}{r}\frac{\partial}{\partial r} + \frac{\partial^2}{\partial r^2} + \frac{1}{r^2}\frac{\partial^2}{\partial \theta^2}\right)$$

The solutions $\psi$ can be defined in polar coordinates as $\Psi(r,\theta)=R(r)\Theta(\theta)$.

$$\frac{\Theta''}{\Theta} = -\frac{2m}{\hbar^2}\left(E - \frac{1}{2}mw^2r^2\right)r^2 - r\frac{R'}{R} - r^2\frac{R''}{R} = \text{constant} = -n^2. \quad \text{(Eq. 4)}$$

(Let $\Theta = e^{in\Theta}$) or $R'' + \frac{1}{r}R' + \frac{2m}{\hbar^2}\left(E - \frac{1}{2}mw^2r^2 - \frac{n^2}{r^2}\right)R = 0$ Assuming that $$\alpha \equiv \frac{mw}{\hbar}$$

and R takes the form of $$R = \exp\left(-\frac{\alpha}{2}r^2\right)\mathcal{R}(r),$$

equation 4 becomes $$\mathcal{R}'' + \frac{1}{r}(1 - 2\alpha r^2)\mathcal{R}' + \left(\frac{2mE}{\hbar^2} - 2\alpha - \frac{n^2}{r^2}\right)\mathcal{R} = 0$$

It will be appreciated that the radius r can be scaled by the factor $r_0$, with $r_0=\sqrt{2/\alpha}$, in which case $$R = \exp\left(-\frac{r^2}{r_0^2}\right)\mathcal{R}\left(\frac{r}{r_0}\right).$$

Assuming $\mathcal{R}$ is a function of $\alpha r^2$: $x \equiv \alpha r^2$, $\mathcal{R} \equiv y(x)$, the function above becomes $$xy'' + (1-x)y' + \left(\frac{E}{2w\hbar} - \frac{1}{2} - \frac{n^2}{4x}\right)y = 0 \quad \text{(Eq. 5)}$$

When n=0, this equation is the Laguerre's equation, and has the Laguerre polynomials as its solution.

Equation 5 can be rewritten in the following manner:

$$xy'' + (1-x)y' + \left(E_k - \frac{n^2}{x}\right)y = 0 \quad \text{(Eq. 6)}$$

When n=0, the solutions of equation 6 are Laguerre polynomials $L_k(x)$. When n≠0, the solutions are based on the Whittaker functions:

$$\frac{e^{x/2}W_{k+1/2,n}(x)}{\sqrt{(x)}}$$

The Whittaker function is given by:

$$W_{k+1/2,n}(x) = \quad \text{(Eq. 7)}$$
$$x^{1/2+n}e^{-x/2}\left[1 + \frac{n-k}{1!(2n+1)}x + \frac{(n-k)(n-k+1)}{2!(2n+1)(2n+2)}x^2 + \ldots\right]$$

This simplifies to the solution $S_{k,n}(x)$ as follows:

$$S_{k,n}(x) = x^n\left[1 + \frac{n-k}{1!(2n+1)}x + \frac{(n-k)(n-k+1)}{2!(2n+1)(2n+2)}x^2 + \ldots\right] \quad \text{(Eq. 8)}$$

When n=0, the Laguerre polynomials are recovered. The polynomials are finite.

The solution $S_{k,n}(x)$ are orthogonal given an exponential weight function:

$$\int_0^\infty e^{-x} S_{k,n}(x) S_{k',n'}(x) dx = \delta[k-k']\delta[n-n'], \quad \text{(Eq. 9)}$$

where k and n are integers and $\delta$ is a discrete Dirac indicator, $\delta[0]=1$ and $\delta[i]=0$ for $i\neq 0$.

This property is used to create two dimensional kernels $K_{k,n}(r,\theta)$ in accordance with an embodiment of the invention. These kernels are defined as follows:

$$K_{k,n}(r,\theta)^{\pm} = e^{-r^2/2}S_{k,n}(r^2)e^{\pm in\theta}$$

The orthogonality of the kernels $K_{k,n}(r,\theta)$ can be verified in the following manner:

$$\int_{-\infty}^{\infty}\int_{-\infty}^{\infty} K_{k,n}(x,y)K_{k',n'}(x,y)dxdy = \int_0^\infty \int_0^{2\Pi} K_{k,n}(r,\theta)K_{k',n'}(r,\theta)rdrd\theta$$
$$= \int_0^\infty e^{-r^2/2}S_{k,n}(r^2)e^{-r^2/2}S_{k',n'}(r^2)rdr \cdot$$
$$\int_0^{2\Pi} e^{\pm in\theta}e^{\pm in'\theta}d\theta$$
$$= \frac{1}{2}\int_0^\infty e^{-u}S_{k,n}(u)S_{k',n'}(u)du \cdot$$

-continued $$\int_0^{2\Pi} e^{\pm in\theta} e^{\pm in'\theta} d\theta = \delta[k-k']\delta[n-n']$$

When n=0, the solutions (based on Laguerre polynomials) form a complete basis of all the rotationally independent functions.

The aerial image A is convolved with one or more convolution kernels $K_{k,n}(r,\theta)$ to determine the resist image R, i.e. the image of the mask pattern in the resist. In an embodiment, the resist image R is calculated in the following manner:

$$R = \sum_{i=0}^{\infty} c_i(A*K_i) + \sum_{i=0}^{\infty} d_i(A*K_{1i})\cdot(A*K_{2i}) \quad \text{(Eq. 10)}$$

wherein R is a bitmap resist image, A is a bitmap aerial image of the mask pattern at substrate level, $K_i$, $K_{1i}$, $K_{2i}$ are orthogonal convolution kernels and $c_i$ and $d_i$ are fitting coefficients, where $0 \le i \le \infty$. The first sum $$\sum_{i=0}^{\infty} c_i(A*K_i)$$

is referred to as linear, while the second sum $$\sum_{i=0}^{\infty} d_i(A*K_{1i})\cdot(A*K_{2i})$$

is referred to as bilinear.

Thus, equation 10 includes two types of model terms: (a) linear terms $(A*K_i)$ and (b) bilinear terms $(A*K_{1i}).(A*K_{2i})$. The star (*) denotes a convolution and the dot (.) denotes a pixel-by-pixel multiplication in the aerial bitmap image.

The bilinear terms $(A*K_{1i}).(A*K_{2i})$ are included to provide a lowest order non-linear response of the resist image to the aerial image. The bilinear terms are the equivalent of a squaring in terms of the frequency support, which results in the doubling of frequencies. Indeed, when two band-limited signals are multiplied, their respective frequency limits are added. In an embodiment, the resist image pixels correspond to half the size of the aerial image pixels. Therefore, it is possible to double the frequency without introducing aliasing errors. With linear terms, the aerial image A is convolved with a kernel, which means that the limit frequency of the aerial image A and the linear term are the same. However, the resist image includes twice the frequency availability. Bilinear convolutions are used to conceptually approximate the reaction-diffusion equations, which are used in the slow and physical models, such as KLA-Tencor's Prolith™ or Brion's LithoCruiser™.

In one implementation, the orthogonal convolution kernels $K_{k,n}(r,\theta)$ are selected so that the transformation of the aerial image A into the resist image R has the properties of rotational and mirror symmetry conservation.

The transformation of the aerial image into the resist image has the property of rotational symmetry if the rotation operation does not affect the result of the transformation regardless of whether it is performed before or after the transformation.

Figure 3:
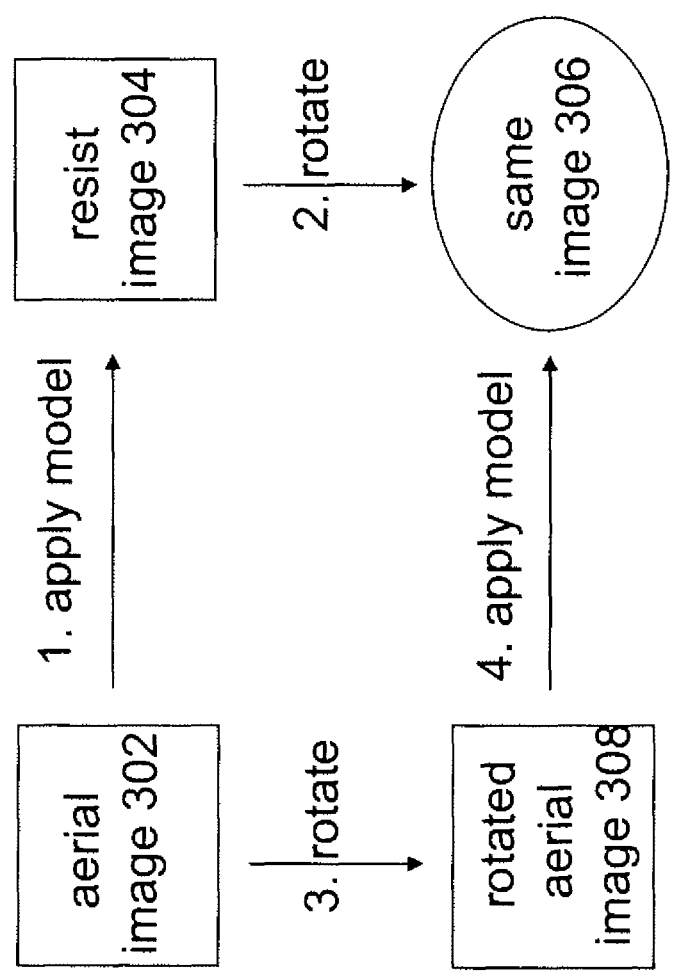
FIG. 3 illustrates the rotational property of the process of FIG. 2.

For example, FIG. 3 shows a transformation that has the property of rotational conservation. As shown in FIG. 3, a resist image 304 that is first calculated with the transformation and then rotated provides the same resist image 306 as a resist image that is calculated by first rotating the aerial image 302 and then applying the transformation to the rotated aerial image 308.

Figure 4:
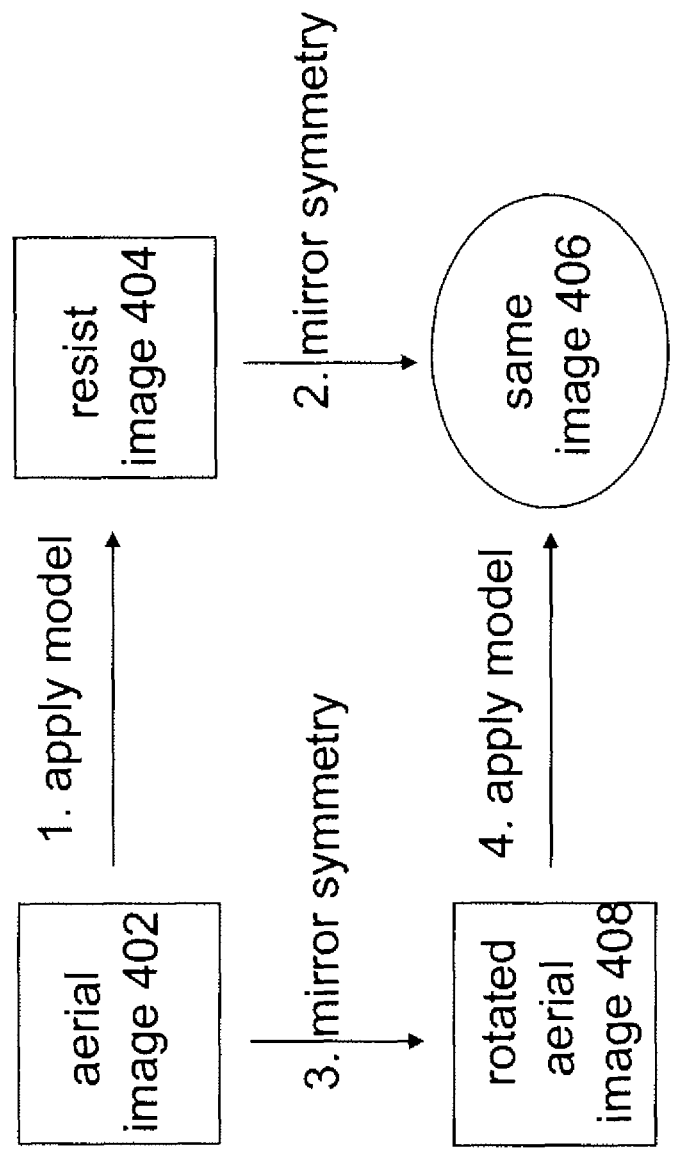
FIG. 4 illustrates the mirror symmetry property of the process of FIG. 2.

Similarly, the transformation of the aerial image into resist image has the property of mirror symmetry if the symmetry operation does not affect the result of the transformation regardless of whether it is performed before or after the transformation. In other words, if the aerial image A is symmetrical (i.e. A(x,y)=A(-x,y)), then the resist image R is symmetrical too (i.e. R(x,y)=R(-x,y)). For example, FIG. 4 shows a transformation that has the property of symmetry conservation. As shown in FIG. 4, a resist image 404 that is first calculated with the transformation and then subject to a symmetry operation provides the same resist image 408 as a resist image that is calculated by first performing a symmetry operation on the aerial image 402 and then applying the transformation to the mirrored aerial image 404.

In an embodiment, the kernels that provide a rotational conservation for the linear terms are the kernels with n=0 (based on Laguerre polynomials).

In an embodiment, the pair of solutions of convolution kernels that provide a rotational conservation for the bilinear terms are defined as follows:

$$K_{k,n}(r,\theta)^+ = e^{-r^2/2} S_{k,n}(r^2) e^{+in\theta} \text{ and}$$

$$K_{k',n}(r,\theta)^- = e^{-r^2/2} S_{k',n}(r^2) e^{-in\theta}, \text{ where } k, k', \text{ and } n \text{ are integers.}$$

The radius r can be scaled by the factor $r_0$ in the linear terms, with $r0 = \sqrt{2/\alpha}$. As a result, the kernels for the linear terms can be rewritten as follows:

$$K_{k,n}(r,\theta)^\pm = e^{-r^2/r_0^2/2} S_{k,n}\left(\frac{r^2}{r_0^2}\right) e^{\pm in\theta}$$

Similarly, the radius r can be scaled by the factor $r_1$ in the bilinear terms, with $r1 = \sqrt{2/\alpha}$. As a result, the kernels for the bilinear terms can be rewritten as follows:

$$K_{k,n}(r,\theta)^\pm = e^{-r^2/r_1^2/2} S_{k,n}\left(\frac{r^2}{r_1^2}\right) e^{\pm in\theta}$$

The proof that it is necessary that the kernels have this form [0065] to follow the property of rotational conservation is evidenced by the following calculation: Indeed, assuming that the two kernels are:

$$K_{k,n}(r,\theta)^+ = e^{-r^2/2} S_{k,n}(r^2) e^{+in\theta} \text{ and}$$

$$K_{k',n}(r,\theta)^- = e^{-r^2/2} S_{k',n}(r^2) e^{-in\theta}, \text{ where } k, k', n \text{ and } n' \text{ are integers,}$$

and assuming that the aerial image A(x,y) is defined as follows A(x, y)=$\delta(x)\delta(y)$, the bilinear terms become:

$$(A*h_1).(A*h_2) = K_{k,n}(r,\theta)^\pm \cdot K_{k',n'}(r,\theta)^=$$

$$(A*h_1).(A*h_2) = e^{-r^2/2} S_{k,n}(r^2) e^{\pm in\theta} e^{-r^2/2} S_{k',n'}(r^2) e^{\pm in'\theta}$$

$$(A*h_1).(A*h_2) = e^{-r^2} S_{k,n}(r^2) S_{k',n'}(r^2) e^{\pm in\theta} e^{-in'\theta}$$

It is necessary that n=-n'.

The proof that it is sufficient that these kernels have this form to follow the property of rotational conservation is evidenced by the following calculation:
For any A:

$$(A*h_1).(A*h_2)(x,y) = \iint A(x-u,y-v)e^{-r^2/2}S_{k,n}(r^2)e^{+in\theta}dudv.\iint A(x-u',y-v')e^{-r'^2/2}S_{k',n}(r'^2)e^{-in\theta'}du'dv'$$

By first changing the variables from cartesian to polar, the following relations are obtained: $x=r_0 \cos(\theta_0)$, $y=r_0 \sin(\theta_0)$, $u=r\cos(\theta)$, $v=r\sin(\theta)$, $u'=r'\cos(\theta')$, and $v'=r'\sin(\theta')$. The first integral then becomes:

$$(A*h_1) = \iint A(x-u,y-v)e^{-r^2/2}S_{k,n}(r^2)e^{+in\theta}dudv$$

If the input image A is rotated by an arbitrary angle $\alpha$, the new coordinates are given by:

$$\begin{bmatrix} \cos\alpha & -\sin\alpha \\ \sin\alpha & \cos\alpha \end{bmatrix}\begin{bmatrix} x-u \\ y-v \end{bmatrix}$$

Then, the first coordinate for the change above is given by:

$$= \cos\alpha(x-u) - \sin\alpha(y-v)$$
$$= \cos\alpha(r_0\cos\theta_0 - r\cos\theta) - \sin\alpha(r_0\sin\theta_0 - r\sin\theta)$$
$$= r_0(\cos\theta_0\cos\alpha - \sin\theta_0\sin\alpha) - r(\cos\theta\cos\alpha - \sin\theta\sin\alpha)$$
$$= r_0\cos(\theta_0 + \alpha) - r\cos(\theta + \alpha)$$

The factor $\cos(\theta_0+\alpha)$ shows that the output image is rotated. The factor $\cos(\theta+\alpha)$ by doing a change of variable $\theta+\alpha \to \theta$, creates a factor $e^{-in\alpha}$ in front of the first integral. The other coordinate of the transform is similar. Similar computations for the second integral are equivalent except that it brings a factor $e^{in\alpha}$, thus cancelling the first factor.

The formalism of section [0058] can be rewritten to ensure that the resist image does not have an imaginary part. For each pair of bilinear terms:

$$z_n.(A*S_{k_1,n}(r_1^2)e^{+in\theta_1}).(A*S_{k_2,n}(r_2^2)e^{-in\theta_2}) + z_{-n}.(A*S_{k_1,-n}(r_1^2)e^{-in\theta_1}).(A*S_{k_2,-n}(r_2^2)e^{+in\theta_2})$$

The above sum can be rewritten as follows: (where $\Re$ is the real part, $\Im$ is the imaginary part)

$$d_n.\Re\lfloor(A*S_{k_1,n}(r_1^2)e^{+in\theta_1}).(A*S_{k_2,n}(r_2^2)e^{-in\theta_2})\rfloor + d_n'.\Im\lfloor(A*S_{k_1,n}(r_1^2)e^{+in\theta_1}).(A*S_{k_2,n}(r_2^2)e^{-in\theta_2})\rfloor$$

Where $d_n = [z_n + \overline{z_{-n}}]/2$ and $d_n' = [z_{-n} + \overline{z_n}]/2$ The sum of these two terms is real if and only if both $d_n$ and $d_n'$ are real.

The property of symmetry conservation is verified if and only if $d_n'$ is zero. A proof of necessary can be seen by using $A(x, y) = \delta(x-1)\delta(y) + \delta(x+1)\delta(y)$ as a counter example. For the proof of sufficiency, the mirror symmetry is computed along the y axis of the resist image:

$$R_{flip}(x,y) = R(-x,y) = (A*h_1).(A*h_2)(-x,y)$$

$$R_{flip}(x,y) = \iint A(-x-u,y-v)e^{-r^2/2}S_{k,n}(r^2)e^{+in\theta}dudv.\iint A(-x-u',y-v')e^{-r'^2/2}S_{k',n}(r'^2)e^{-in\theta'}du'dv'$$

By a change of variable: $u \to -u$, we have $\theta \to \pi-\theta$, $du \to -du$ and the integration bounds are switched:

$$\iint A_{flip}(x-u, y-v)e^{-r^2/2}S_{k,n}(r^2)e^{-in\theta}dudv.$$

$$R_{flip}(x,y) = \frac{\iint A_{flip}(x-u', y-v')e^{-r'^2/2}S_{k',n}(r'^2)e^{+in\theta'}du'dv'}{\iint A_{flip}(x-u, y-v)e^{-r^2/2}S_{k,n}(r^2)e^{+in\theta}dudv.}$$

$$\iint A_{flip}(x-u', y-v')e^{-r'^2/2}S_{k',n}(r'^2)e^{-in\theta'}du'dv'$$

The symmetry condition implies that:

$$R_{flip}(x,y) = \iint A_{flip}(x-u,y-v)e^{-r^2/2}S_{k,n}(r^2)e^{+in\theta}dudv.\iint A_{flip}(x-u',y-v')e^{-r'^2/2}S_{k',n}(r'^2)e^{-in\theta'}du'dv'$$

A number if equal to its complex conjugate if and only if its imaginary part is zero. With the formalism of section [0069], this implies that the coefficient $d_n'$ in front of $\Im\lfloor(A*S_{k_1,n}(r_1^2)e^{+in\theta_1}).(A*S_{k_2,n}(r_2^2)e^{-in\theta_2})\rfloor$ is equal to zero.

Proof for the mirror symmetry along any other axes is done by combining the property of rotation conservation of section [0068] and the property of mirror symetry conservation along the y-axis.

An embodiment of the invention provides a fast implementation of the model after it has been fitted. In equation 10, the two kernels $K_i$ and $K_{2i}$ of the bilinear terms can be different. An eigenvalue transformation of the kernels allows one to implement only transformed terms where $K_i$ and $K_{2i}$ are the same. This reduces the number of kernels to be applied, from $n^2$ pairs to n terms (on average). In the formalism that follows, the convolutions are treated as 1D for simplicity of the writing, but by simple bookkeeping, the procedure is extended to 2D filters. The procedure is as follows:
For a given, fixed n, the following equation is computed:

$$R = \sum_{k,k'} z_{k,k'}(A*K_{k,n}) \cdot (A*K_{k',n})$$

The matrix $Z = \lfloor z_{k,k'} \rfloor$ is built and its eigenvalues $w_i$ and corresponding eigenvectors $V_i$ are computed. The matrix $K = \lfloor K_{k,n} \rfloor$ is created and the vectors $Y_i = K.V_i$ are computed. The following relation is obtained $$R = \sum_i w_i |A*Y_i|^2.$$

The number of convolutions needed increases linearly, instead of square. The procedure is repeated for every n. This computation may be done once and applied to various aerial images.

Figure 5:
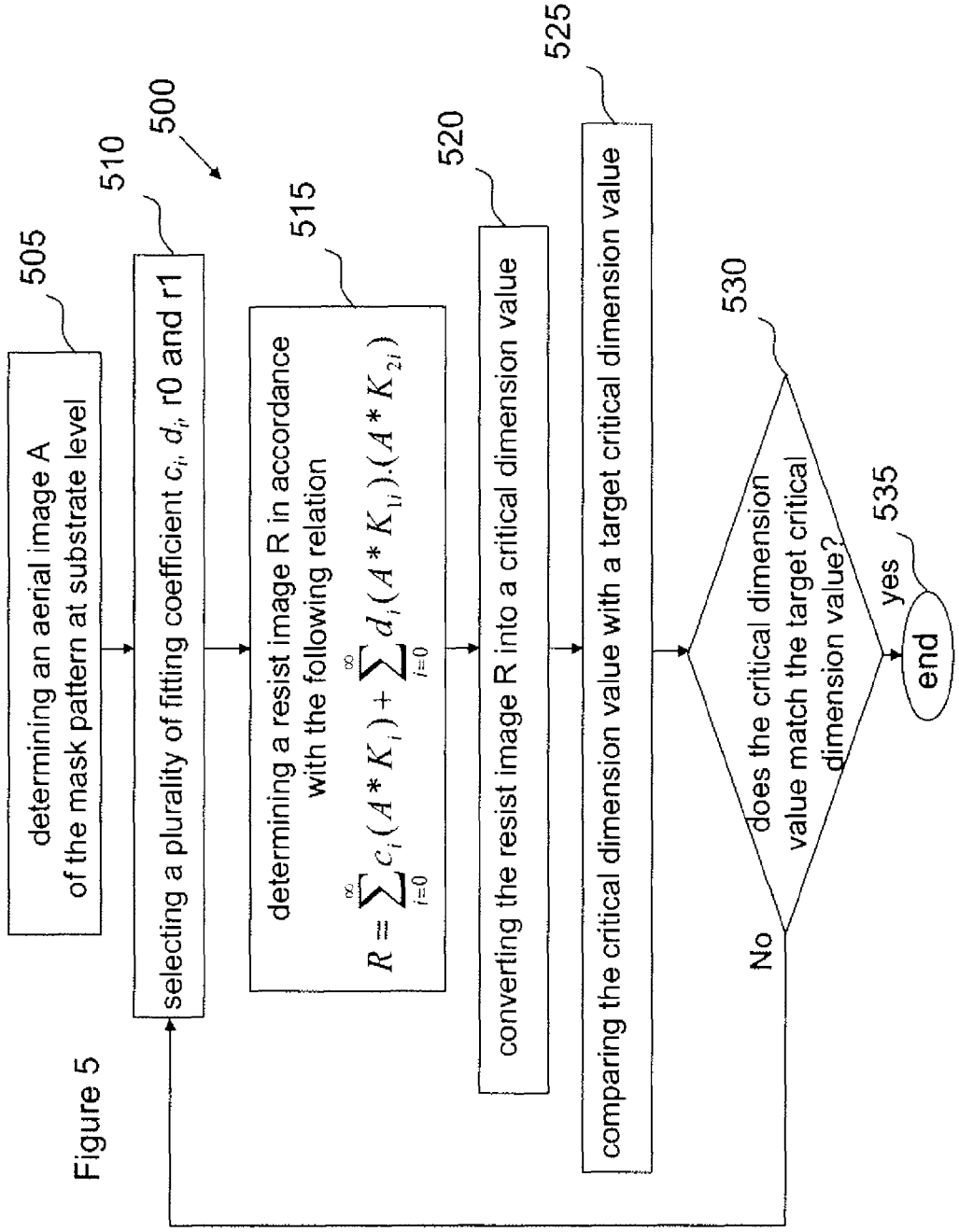
FIG. 5 is an exemplary flowchart illustrating a process of obtaining a resist image in accordance with an embodiment of the invention.

Referring now to FIG. 5, this figure is an exemplary flowchart illustrating a process 500 of obtaining a resist image R in accordance with an embodiment of the invention. The process 500 begins at procedure 505 where an aerial image A of the mask pattern is determined at substrate level. Calculation of the aerial image A may be performed in the same manner as in procedure 205 of process 200. After obtaining the aerial image A, the process 500 proceeds to procedure 510 where the plurality of fitting coefficients $c_i$ and $d_i$ of equation 10 are selected. Fitting coefficients $c_i$ and $d_i$ are linear coefficients that are iteratively adjusted to determine the resist image. Fitting coefficients $c_i, d_i, r_0$ and $r_1$ can be automatically generated or selected by the user. Subsequently, a resist image R is calculated using equation 10 (procedure 515). The result of the transformation of the aerial image A by equation 10 provides a resist image R that is converted into a critical dimension (CD) value at procedure 520. The CD value (or contour) obtained is compared with a target value at procedure 520. The target value is obtained by measuring an actual substrate. The actual substrate to be measured is prepared by use of the optical tools which were used to obtain the aerial image. Then, the method proceeds to procedure 530 where a determination is made as to whether the CD value matches the target CD value. When the CD value is within a predetermined range, i.e., equal to or close to the target value (step 18: yes), the process ends (procedure 535) and the CD value represents an accurate prediction of the critical dimension of the mask pattern in the resist. On the other hand, when the CD value is not within the predetermined range, the method proceeds back to procedure 510 where new values of fitting coefficients $c_i$, $d_i$, $r_0$ and $r_1$ are selected.

The iterative process of procedures 510-530 can be performed using different types of regression schemes. The fitting of coefficients $c_i$ and $d_i$ consists of solving the over-determined system Bx=C, where x represents a vector that contains all the coefficients $c_i$ and $d_i$ to be determined, B represents a matrix where each column corresponds to a resist term and each row corresponds to one gauge (i.e. the term $B_{i,j}$ is the intensity of term image j at jauge i) and the vector C contains the target intensity. Since the system is over-determined, it cannot be solved exactly. Therefore, in one implementation, the system is solved by determining the coefficients of the vector x that minimizes $\|Ax-B\|^2 + \alpha^2 \|x\|^2$ (Eq. 11). The term $\alpha$ is fixed and depends on the amount of noise. In the context of model fitting, this approach is known as a ridge regression, a Tikhonov regularization or Philips regularization. The parameter $\alpha$ can be obtained by using a Wahba routine, as will be appreciated by one skilled in the art. Once the parameter $\alpha$ is determined, equation 11 can be solved to obtain the fitting coefficients.

The use of the process shown in the embodiments of FIGS. 2 and 5 for calculating the resist image provides significant benefits over conventional approaches. Contrary to conventional approaches, the kernels used in embodiments of the invention form a complete basis. This allows one to improve the fitting accuracy, as it is possible to cover the space of all possible images.

Moreover, contrary to conventional approaches, the convolution kernels form an orthogonal basis. The orthogonality lowers the risk cancellations of terms in Equation 10 during the fitting process, due to degeneracy or redundancy. As a result, it is possible to cover more of the vector space with the same number of kernels.

In addition, it will be appreciated that the process of FIGS. 2 and 5 can be carried out with a much more reduced set of parameters and thus requires less user interaction as compared to a conventional simulation method. For example, the user does not have to experiment several search ranges nor does the user have to turn on/off several terms. Instead, the search is straightforward and there are a limited number of settings.

Further, it will be appreciated that the resist image R can be determined with a limited number of terms in Equation 10. For example, the use of the following collection of vector basis yields good results:

TABLE 1

| Type | n | k1 | K2 | Radius of Gaussian |
|---|---|---|---|---|
| Linear (HL) | 0 | 0 | | $r_0$ |
| Linear (HL) | 0 | 1 | | $r_0$ |
| Linear (HL) | 0 | 2 | | $r_0$ |
| Linear (HL) | 0 | 3 | | $r_0$ |
| Linear (HL) | 0 | 4 | | $r_0$ |
| Bilinear (HB) | 0 | 0 | 0 | $r_1$ |
| Bilinear (HB) | 0 | 0 | 1 | $r_1$ |
| Bilinear (HB) | 0 | 0 | 2 | $r_1$ |
| Bilinear (HB) | 0 | 1 | 1 | $r_1$ |
| Bilinear (HB) | 0 | 1 | 2 | $r_1$ |
| Bilinear (HB) | 0 | 2 | 2 | $r_1$ |
| Bilinear (HB) | 1 | 1 | 1 | $r_1$ |
| Bilinear (HB) | 1 | 1 | 2 | $r_1$ |
| Bilinear (HB) | 1 | 2 | 2 | $r_1$ | where n, k1 and k2 are the coefficients of the solution kernels $$K_{k,n}(r,\theta)^{\pm} = e^{-\frac{r^2}{r_1^2/2}} S_{k,n}\left(\frac{r^2}{r_1^2}\right) e^{\pm in\theta}$$

for a bilinear term, and $$K_{k,n}(r,\theta)^{\pm} = e^{-\frac{r^2}{r_0^2/2}} S_{k,0}\left(\frac{r^2}{r_0^2}\right)$$

for a linear term.

In an embodiment, the search range of radii is defined as follows:

| | minimum | maximum | step |
|---|---|---|---|
| $r_0$ | 20 | 100 | 10 |
| $r_1$ | 20 | 100 | 10 |

The calculated resist image R can be used to determine the critical dimension of a pattern, the contour of a pattern and whether some contours of resist patterns are merged or cut. The calculated image can also be used to determine the size of optical proximity correction features. Further, it will be appreciated that the procedures and methods defined hereinabove can also be used to calculate an etch image.

It will be appreciated that the different acts involved in calculating the image of the mask in the resist may be executed according to machine executable instructions or codes. These machine executable instructions may be embedded in a data storage medium. A processor may be configured to execute the instructions. In one embodiment, the resist image computations are carried out in FPGA (Field Programmable Gate Array) in a similar manner as the aerial image computations.

Software functionalities of a computer system involving programming, including executable codes, may be used to implement the above described imaging model. The software code may be executable by a general-purpose computer. In operation, the code and possibly the associated data records may be stored within a general-purpose computer platform. At other times, however, the software may be stored at other locations and/or transported for loading into an appropriate general-purpose computer system. Hence, the embodiments discussed above involve one or more software or computer products in the form of one or more modules of code carried by at least one machine-readable medium. Execution of such codes by a processor of the computer system enables the platform to implement the functions in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as discussed above. Volatile media include dynamic memory, such as the main memory of a computer system. Physical transmission media include coaxial cables, copper wires and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read or send programming codes and/or data. Many of these forms of computer readable media may be involved in carrying one or more sequences of one or more instructions to a processor for execution.

While specific embodiments of the invention have been described above, it will be appreciated that the invention may be practiced other than as described. The description is not intended to limit the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in, for example, a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The lithographic apparatus may also be of a type wherein a surface of the substrate is immersed in a liquid having a relatively high refractive index, e.g., water, so as to fill a space between a final element of the projection system and the substrate Immersion liquids may also be applied to other spaces in the lithographic apparatus, for example between the patterning device and a first element of the projection system Immersion techniques are well known in the art for increasing the numerical aperture of projection systems.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced other ways than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to those skilled in the art that modifications may be made to the invention as described without departing from the scope of the claims set out below.

What is claimed is:

1. A method implemented by a computer processor for simulating a resist image, wherein the resist image comprises an image of a portion of a design layout to be lithographically projected onto a resist coated on a substrate, the method comprising:
   determining an aerial image of the portion of the design layout at substrate level; and
   transforming the aerial image into the resist image by convolving the aerial image with selected convolution kernels having both linear and bilinear terms.

2. The method of claim 1, wherein the transforming step includes:
   selecting the convolution kernels that form a complete basis, covering a vector space of all possible resist images.

3. The method of claim 1, wherein the transforming step includes:
   selecting the convolution kernels that form an orthogonal basis, wherein correlation between the selected convolution kernels is minimal.

4. The method of claim 3, wherein the selected convolution kernels comprise solutions of a two-dimensional quantum harmonic oscillator.

5. The method of claim 4, wherein the solutions are based on Laguerre and Whittaker functions that modulate Gaussian kernels and form the orthogonal basis.

6. The method of claim 1, wherein the transforming step includes:
   selecting the convolution kernels to preserve mirror symmetry of the resist image.

7. The method of claim 1, wherein the transforming step further includes:
   selecting the convolution kernels such that a pair of convolution kernels has rotationally-independent bilinear terms, thereby preserving rotational symmetry of the resist image.

8. The method of claim 1, wherein the simulation of the resist image is based on an empirical model.

9. The method of claim 8, wherein the bilinear terms in the convolution kernels conceptually approximate chemical reaction-diffusion equations in the empirical model.

10. A non-transitory computer program product having computer executable instructions for a computer processor to perform a method for simulating a resist image, wherein the resist image comprises an image of a portion of a design layout to be lithographically projected onto a resist coated on a substrate, the method comprising:
- determining an aerial image of the portion of the design layout at substrate level; and
- transforming the aerial image into the resist image by convolving the aerial image with selected convolution kernels having both linear and bilinear terms.

11. The computer program product of claim 10, wherein the transforming step includes:
- selecting the convolution kernels that form a complete basis, covering a vector space of all possible resist images.

12. The computer program product of claim 10, wherein the transforming step includes:
- selecting the convolution kernels that form an orthogonal basis, wherein correlation between the selected convolution kernels is minimal.

13. The computer program product of claim 12, wherein the selected convolution kernels comprise solutions of a two-dimensional quantum harmonic oscillator.

14. The computer program product of claim 13, wherein the solutions are based on Laguerre and Whittaker functions that modulate Gaussian kernels and form the orthogonal basis.

15. The computer program product of claim 10, wherein the transforming step includes:
- selecting the convolution kernels to preserve mirror and rotational symmetry of the resist image.

16. The computer program product of claim 15, wherein the transforming step further includes:
- selecting the convolution kernels such that a pair of convolution kernels has rotationally-independent bilinear terms, thereby preserving rotational symmetry of the resist image.

17. The computer program product of claim 10, wherein the simulation of the resist image is based on an empirical model.

18. The computer program product of claim 17, wherein the bilinear terms in the convolution kernels conceptually approximate chemical reaction-diffusion equations in the empirical model.

19. A method implemented by a computer processor for simulating an image of a portion of a design layout to be lithographically etched on a substrate, the method comprising:
- determining an aerial image of the portion of the design layout at substrate level; and
- transforming the aerial image into an etch image by convolving the aerial image with selected convolution kernels, having both linear and bilinear terms, wherein the etch image is representative of the image of the design layout lithographically etched on the substrate.

20. The method of claim 19, wherein the transforming step includes:
- selecting the convolution kernels that form a complete basis, covering a vector space of all possible etch images.

21. The method of claim 19, wherein the transforming step includes:
- selecting the convolution kernels that form an orthogonal basis, wherein correlation between the selected convolution kernels is minimal.

22. The method of claim 21, wherein the selected convolution kernels comprise solutions of a two-dimensional quantum harmonic oscillator.

23. The method of claim 22, wherein the solutions are based on Laguerre and Whittaker functions that modulate Gaussian kernels and form the orthogonal basis.

24. The method of claim 19, wherein the transforming step includes:
- selecting the convolution kernels to preserve mirror symmetry of the etch image.

25. The method of claim 19, wherein the transforming step further includes:
- selecting the convolution kernels such that a pair of convolution kernels has rotationally-independent bilinear terms, thereby preserving rotational symmetry of the etch image.

26. The method of claim 19, wherein the simulation of the etch image is based on an empirical model.

* * * * *